US008055077B2

(12) United States Patent
Mucha et al.

(10) Patent No.: US 8,055,077 B2
(45) Date of Patent: Nov. 8, 2011

(54) R/T DISPLAY COMPRESSION PRESERVING INTENSITY INFORMATION

(75) Inventors: Jeff W. Mucha, Portland, OR (US); Robert L. Beasley, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 1376 days.

(21) Appl. No.: 11/292,689

(22) Filed: Dec. 2, 2005

(65) Prior Publication Data

US 2007/0133887 A1    Jun. 14, 2007

(51) Int. Cl.
*G06K 9/36* (2006.01)

(52) U.S. Cl. ............ 382/207; 382/298; 702/67; 702/70; 702/71; 702/124; 327/106; 345/208; 345/440.1; 348/185; 324/379

(58) Field of Classification Search .......... 382/232; 345/660
See application file for complete search history.

(56) References Cited

U.S. PATENT DOCUMENTS

| | | | | |
|---|---|---|---|---|
| 5,488,698 A | * | 1/1996 | Oliver et al. | 358/1.11 |
| 5,517,105 A | | 5/1996 | Holzwarth | |
| 6,072,830 A | * | 6/2000 | Proctor et al. | 375/240.22 |
| 6,272,252 B1 | * | 8/2001 | Eldridge et al. | 382/232 |
| 6,784,891 B2 | * | 8/2004 | Inuzuka et al. | 345/555 |
| 2003/0123071 A1 | * | 7/2003 | Eldridge et al. | 358/1.9 |
| 2003/0152266 A1 | * | 8/2003 | Ivers et al. | 382/169 |

FOREIGN PATENT DOCUMENTS

| | | |
|---|---|---|
| EP | 0521669 | 1/1993 |
| EP | 0775915 | 5/1997 |
| JP | 03150473 | 6/1991 |
| JP | 05273246 | 10/1993 |

OTHER PUBLICATIONS

Patent Abstracts of Japan, Publication No. 03150473, Publication Date: Jun. 26, 1991; 1 page.
Patent Abstracts of Japan, Publication No. 05273246, Publication Date: Oct. 22, 1993; 1 page.

* cited by examiner

*Primary Examiner* — John Lee
(74) *Attorney, Agent, or Firm* — Francis I. Gray; Thomas F. Lenihan

(57) ABSTRACT

A realtime display compression for a waveform image uses a priority basis for combining groups of pixels when producing a compressed waveform image in order to preserve intensity information. As an example successive lines of data for the waveform image are demultiplexed into line buffers in a circulating manner, the number of line buffers being a function of the maximum desired integer compression ratio. The outputs from the line buffers are aligned and the corresponding pixels are combined according to a desired compression ratio, one output line for each integer compression ratio. The appropriate compressed line is selected as the output line according to the desired compression ratio, with the totality of the output lines forming the compressed waveform image.

2 Claims, 7 Drawing Sheets

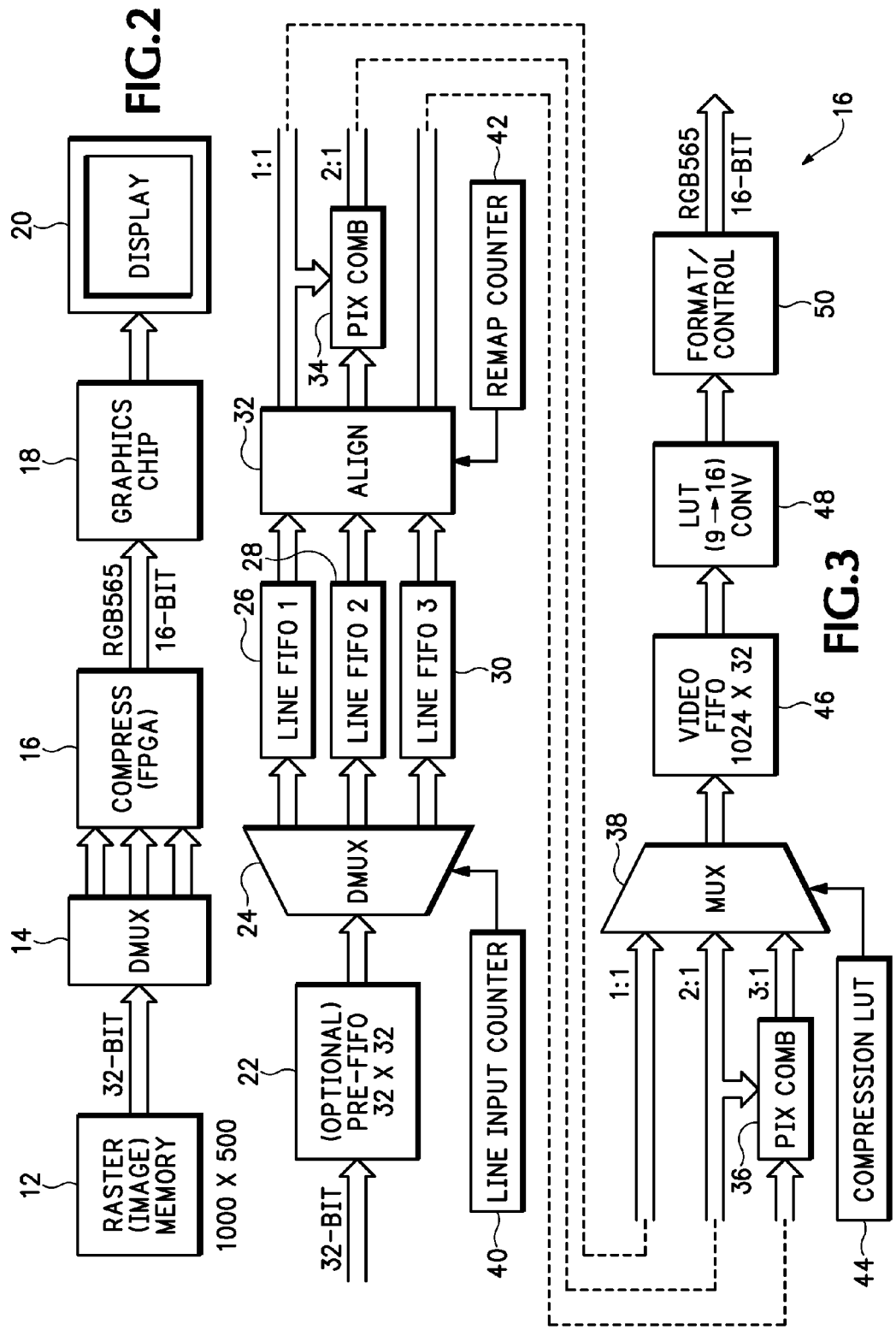

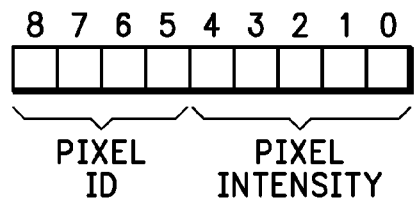
FIG.4
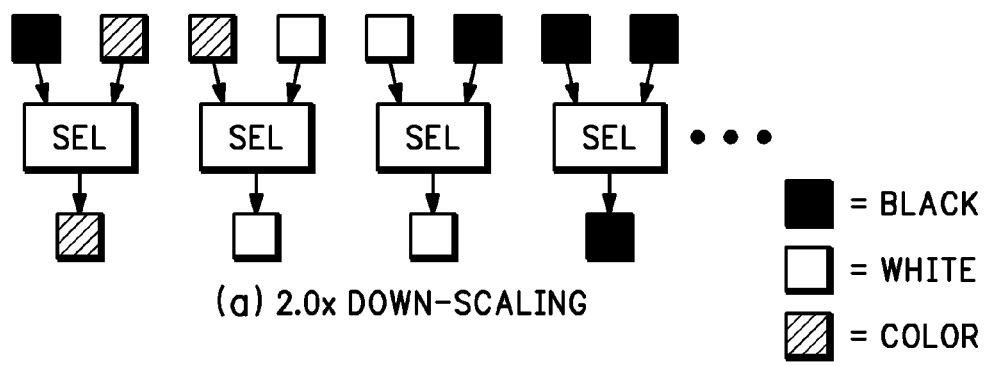
(a) 2.0x DOWN-SCALING
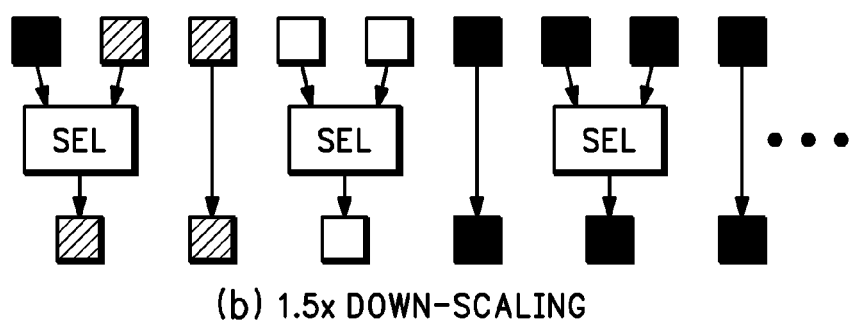
(b) 1.5x DOWN-SCALING
FIG.5

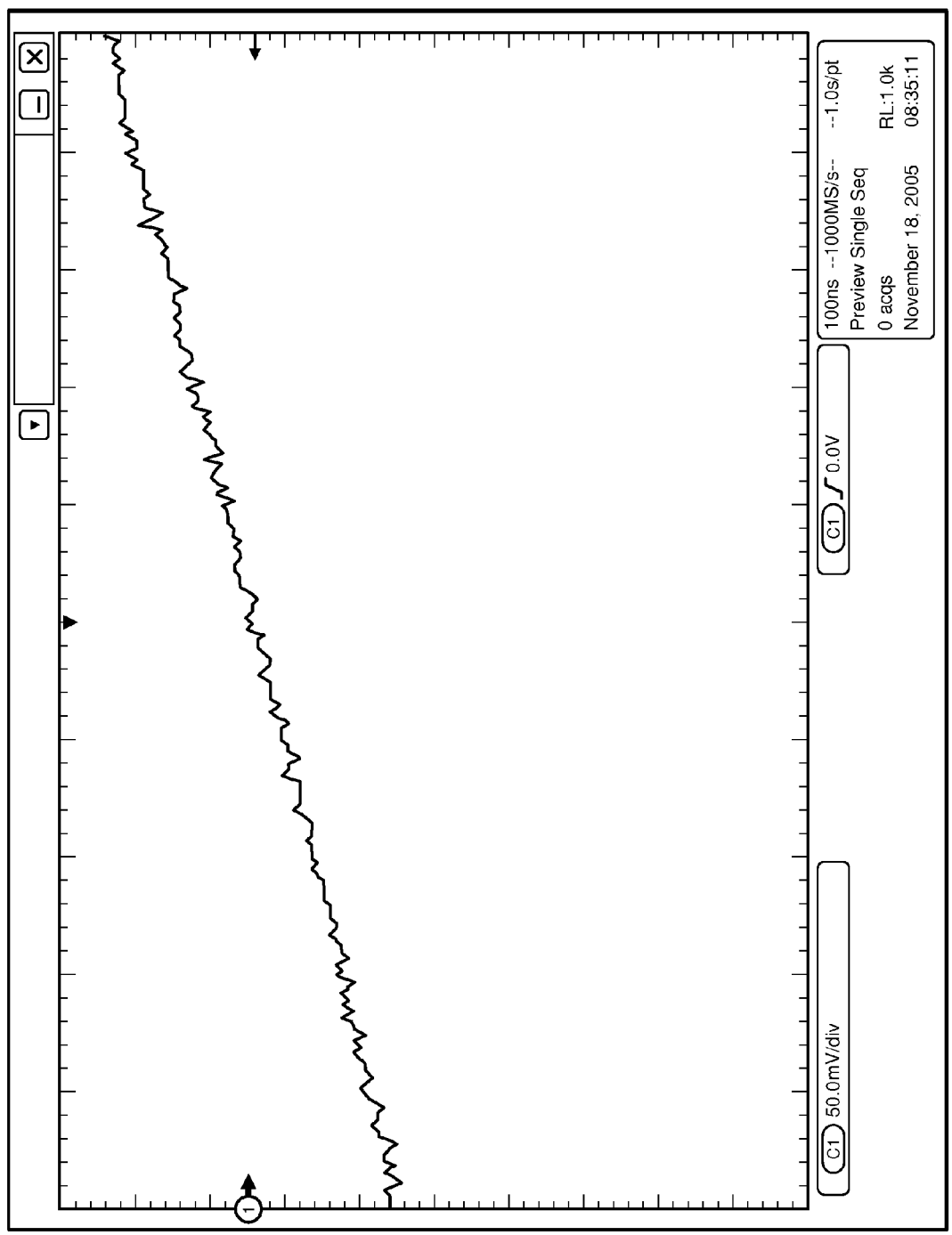

R/T DISPLAY COMPRESSION PRESERVING INTENSITY INFORMATION

BACKGROUND OF THE INVENTION

The present invention relates to the display of a waveform image of an electrical signal, and more particularly to a real-time (R/T) display compression algorithm and circuit for preserving intensity information when the waveform image is down-scaled to fill a variable display area.

It is desirable to present a waveform image on an oscilloscope display in a pleasing manner for a viewer. With the current large liquid crystal display (LCD) panels having a pixel size of 1024×768 (horizontal×vertical), for example, it is important to effectively use the space available. Currently the waveform image is created and stored at a fixed size, such as in a 500×400 raster memory, and then is compressed or expanded (scaled) to support different user interface menu sizes and features. The compression/expansion process occurs as a post-rasterizing step, i.e., after the sampled electrical signal data has been processed to produce the waveform image in the raster memory. Since the electrical signal is being acquired generally on a continuous basis, i.e., for each enabled trigger signal a data record is acquired in the form of a specified number of samples of the electrical signal and stored temporarily until rasterized into the raster memory, the raw data samples are not available for the compression/expansion process.

The raster memory size of 500×400 is reasonable for an LCD display that is 640×480. It allows room above and below the waveform display area on an oscilloscope display for a user interface (UI), and prior UI implementations were simple, not requiring the flexibility that more recent post processing applications, measurements and analysis software packages demand on the display space. As the applications and measurements packages become more prevalent, and trigger capability is expanded, a larger oscilloscope display is useful. To use a larger oscilloscope display, scaling features of off-the-shelf graphics chips are used to scale the 500×400 waveform image to 1000×600. This introduces scaling factors of 1.5× vertically and 2× horizontally. These scaling factors produce very little artifacts, and only up-scaling is used.

In performance oscilloscopes the emerging display architecture is optimized to draw a 1000×500 waveform image, i.e., a larger raster memory is used. This fits readily in an XGA LCD display that is 1024×768. If the waveform image is fixed at this size, the display area that is covered by applications and measurements packages when turned on is wasted when the applications and measurements packages are turned off. The current commercially available graphics chips being used in performance oscilloscopes receive the waveform image at a "zoom video port." This digital video port or bus is generally 16-bits wide and can transfer around 60 frames or images per second, i.e., these graphics chips use a dedicated video port architecture. These graphics chips do an acceptable job of up-scaling the waveform image for "full screen mode", but do not do a good job of down-scaling the waveform image to make room for applications and measurements packages on the display area. These graphics chips work in the red, green, blue (RGB) color space, i.e., the pixel information has red, green and blue content. This color information for each pixel is stored as 16-bit data in the RGB565 format—bits 0-4 represent blue content, bits 5-10 represent green content and bits 11-15 represent red content. When up-scaling is used, a smaller waveform image is expanded into a larger finite space. No information is lost. If nice numbers are used (1.5×, 2.0×, etc.), the result is always uniform and acceptable. Scaling in the RGB color space has the affect of "averaging" the color together since there is no priority—black averaged with white produces grey.

Down-scaling is another story. The graphics chips are optimized for video applications where there are very few sharp images and the viewer's eye does not detect the imperfections. These graphics chips are not optimized for graphics applications with sharp images and fine details against a black background, as is prevalent in oscilloscope waveform image displays. The simplest form of down-scaling is decimation. Pixels are discarded so the waveform image fits physically in less space. A better form of down-scaling is averaging in the RGB color space. A pixel or group of pixels are averaged with a neighboring pixel to produce a result that is the combination of the two. Finite impulse response (FIR) filtering or conventional arithmetic methods implement some form of averaging. However a bright input pixel that has black pixels on either side of it results in a single dim pixel in the down-scaled output result. If this bright pixel makes up the top line of a square wave image display on an oscilloscope, this dimming effect clearly is not a desirable effect when the rest of the square wave image is at full brightness. Therefore using commercial graphics chips optimized for color video results in distorted oscilloscope waveform images that are dimmed in places. For example, a 1000×500 waveform image that is scaled to 1000×210 (2.38× vertical down-scaling) results in a displayed waveform image that has dimmed sections as well as sections that disappear, as shown in FIG. 1. This is because the graphics chips only average over two pixels at this resolution. For down-scaling factors greater than 2× the graphics chips use both decimation and averaging to produce the result which is unacceptable to the viewer and a poor representation of the vertically compressed waveform image.

What is desired is an algorithm and circuit that is capable of compressing a waveform image in a way that does not present spurious information on an oscilloscope display to a viewer.

BRIEF SUMMARY OF THE INVENTION

Accordingly the present invention provides a realtime display compression algorithm and circuit that is optimized for preserving the intensity information of a rasterized waveform image. The realtime display compression uses a priority basis for combining groups of pixels when producing a compressed waveform image in order to preserve intensity information. As an example for vertical image compression successive lines of data for the waveform image are demultiplexed into line buffers in a circulating manner, the number of line buffers being a function of a maximum desired integer compression ratio. The outputs from the line buffers are aligned and the corresponding pixels are combined according to a desired compression ratio, one output line for each integer compression ratio. The appropriate compressed line is selected as the output line according to the desired compression ratio, with the totality of the output lines forming the compressed waveform image.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 2 is a block diagram view of a system using realtime display compression according to the present invention.

FIG. 3 is a block diagram view of a realtime display compression circuit according to the present invention.

FIG. 4 is a representative graphic view of a data word used realtime display compression according to the present invention.

FIGS. 5a and 5b are representative graphic views of a realtime display compression algorithm for (a) a 2.0× down-scaling and (b) a 1.5× down-scaling according to the present invention.

FIG. 6 is a plan view of a full scale waveform image display.

DETAILED DESCRIPTION OF THE INVENTION

Figure 1:
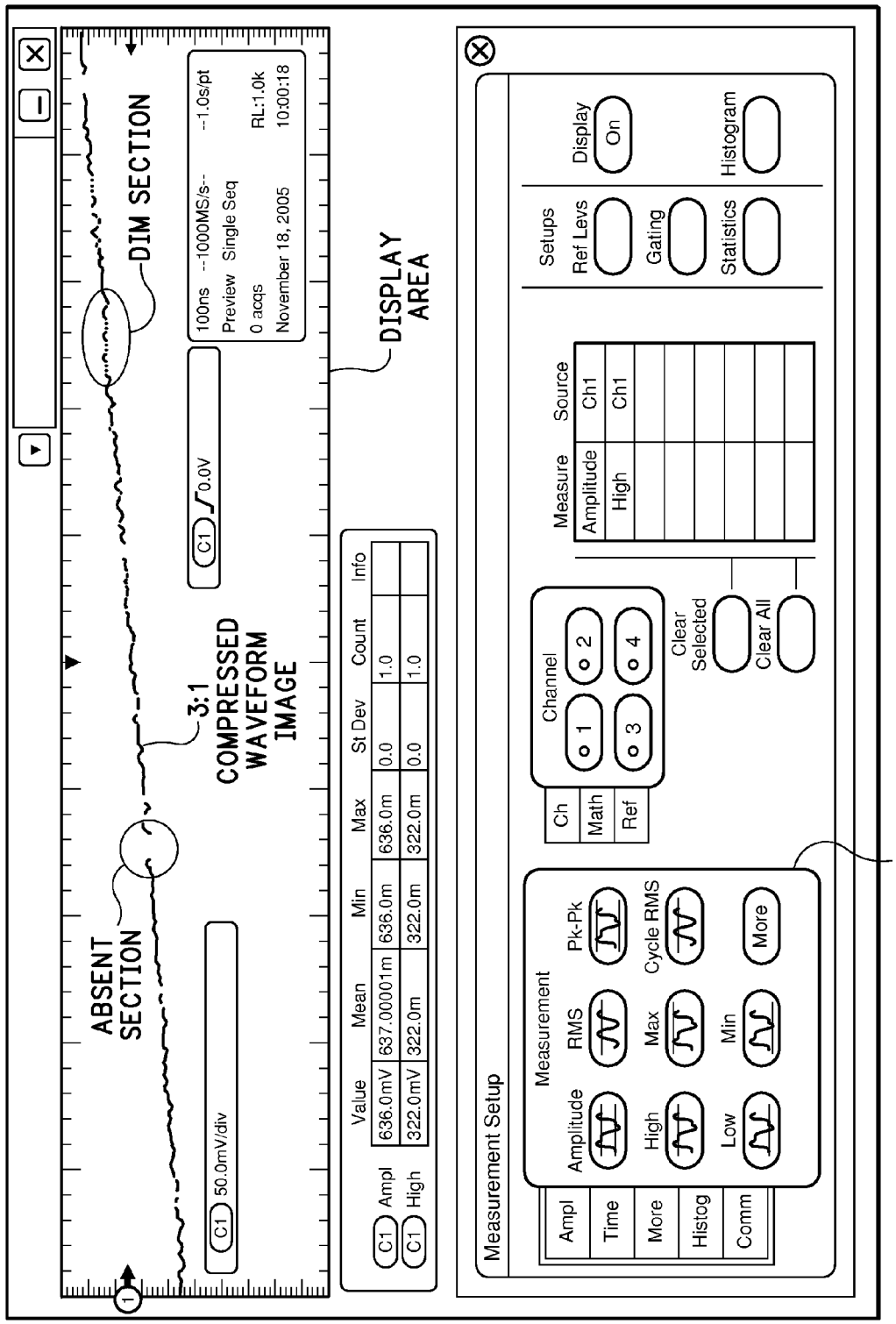
FIG. 1 is a plan view of a compressed display according to the prior art.

Referring now to FIG. 2 a raster memory 12 contains a full scale rasterized waveform image, i.e., 1000×500. The waveform image data is transferred from the raster memory 12 via a demultiplexer 14 to a compression circuit/algorithm 16, which may be implemented as a field programmable gate array (FPGA) as shown or as circuit elements or as a processing program in a digital signal processor (DSP). For vertical compression the demultiplexer 14 separates the waveform image data into separate lines of data in a recirculating manner, the number of separate line outputs being a function of the maximum desired compression—three line outputs for the present example having a maximum 3:1 compression. Output from the compression circuit/algorithm 16 is a video signal that is formatted according to an appropriate video standard required by a graphics chip 18. The output from the graphics chip 18 drives a display 20 upon which the compressed waveform image and any applications and measurement packages are displayed for a viewer. Since the compression of the waveform image occurs prior to the graphics chip 18, the graphics chip only needs to perform up-scaling as required.

Although any compression factor may be implemented, and compression may be implemented either horizontally, vertically or both, FIG. 3 shows a particular circuit configuration that provides up to 3:1 vertical compression, i.e., the compression circuit/algorithm 16 for this example converts 500 vertical lines of the waveform image to a range of 167-500 vertical lines for the compressed display. The compression is done by looking at one, two or three lines at a time and converting all the corresponding pixels in those lines into single pixels for one compressed line. If there is a non-black pixel in any of the input lines for a given pixel location in the output line, that pixel shows up in the output line and its intensity is preserved. If two different intensity pixels in the input lines compete for the same location in the output line, the pixel with the higher "priority" is displayed in the output line. There is no averaging involved.

In one particular implementation display data from the raster memory 12 is transferred in a 9-bit format, as shown in FIG. 4, where five bits contain intensity content and the other four bits contain identification or priority content. For example the ID content may merely be, for a four-input channel oscilloscope, the input channel from which the waveform image data was derived and a user then may prioritize the input channels for display via the oscilloscope user interface (UI). For oscilloscopes having a color display where the waveform data from each input channel is displayed in a distinct color, the ID may also indicate what color is used to display that data as part of the waveform image. Since data transfers generally are done in increments of $2^n$, such as 16- or 32-bits, each 16-bit data word from the raster memory includes the 9-bit data word with the remaining bits being unused for informational purposes.

The waveform image data from the raster memory 32 streams into an optional pre-FIFO (first-in, first-out) buffer 22 that acts as a rate conversion buffer to get the input data into the clock domain of the logic doing the image compression. The pre-FIFO buffer 22 is not necessary if only display compression is being done as then the compression logic may be run at the input clock rate. The data then streams sequentially via an input demultiplexer 24 into three line FIFOs 26, 28, 30. At the output of the line FIFOs 26, 28, 30 is a redirection section 32 that aligns the outputs from the line FIFOs according to the desired compression factor—1:1, 2:1 or 3:1 in this example. There are three outputs from the redirection section 32: a first output provides a 1:1 compression, a second output is input to a first pixel combiner 34 together with the 1:1 output to provide a 2:1 output, and a third output is input to a second pixel combiner 36 together with the 2:1 output to provide a 3:1 output. The three outputs are then input to an output multiplexer 38 which selects the particular compression output on a line-by-line basis for the output line according to the desired compression factor. For any compression factor where the output multiplexer 38 changes compression output selection from one output line to the next, i.e., compression factors that are not integer ratios, the pattern of compression factors above and below a vertical midpoint is preferably symmetrical.

A line input counter 40 provides a control signal to the input demultiplexer 24 that determines into which line FIFO 26, 28, 30 the next line of waveform image data is input. In this example the line counter 40 steers the outputs of the input demultiplexer 24 after every 1000 data points in the present example to the next line FIFO 26, 28, 30 in a constant loop, i.e., transitions "1, 2, 3, 1, 2, 3, 1, . . . " etc. A remap counter 42 provides proper alignment of lines that are to be combined according to the desired compression factor for that particular output line, i.e., if two lines are to be combined for a 2:1 compression then one line is delayed by one line period with respect to the other in the redirection section 32. If the two lines to be combined happen to be from the line 3 FIFO 30 and the line 1 FIFO 26, the redirection section 32 directs the delayed output from the line 3 FIFO to the 1:1 output and the output from the line 1 FIFO for input to the first pixel combiner 34. Finally a compression lookup table (LUT) 44 provides a control signal to the output multiplexer 38 to select the compression output for the particular output line. As indicated above the compression LUT 44 provides a control signal that allows selection of the compression output on an output line-by-line basis. The remap counter 42 increments by the number of lines that were previously processed so that the pixel combiners 34, 36 are always lined up for the compression of the next input lines. After a whole line is processed, the compression LUT 44 increments to the next entry or output line. This process allows the output image to be any size between 167 and 500 pixels vertically. The compressed output line is input to a video FIFO 46 for conversion into the RGB565 color space and in this example the 9-bit data words are converted into the 16-bit format required for the RGB565 color space by an output lookup table (LUT) 48. The RGB565 video is sent to a thin film transistor (TFT) format/control block 50 where it is then input to the video input port of the graphics chip 18 where up-scaling may be applied if necessary.

FIGS. 5a and 5b illustrate the realtime display compression algorithm for simple examples, such as 2.0× and 1.5× compression factors. As is readily seen, the background black pixels are given a low priority so that any pixel of color including white is selected over the black pixel so that the intensity information is retained in the compressed output line. In the 2.0× example every two pixels are combined according to the priority algorithm, so the compression LUT 44 always selects the 2:1 compression output from the output multiplexer 38, and the remap counter 42 keeps redirecting the line FIFO outputs so that the output lines circulate as 1/2, 3/1, 2/3, etc. with appropriate alignment line delays. For the 1.5× example the compression LUT 44 selects for alternate output lines the 2:1 and 1:1 outputs from the output multiplexer 38, and the remap counter 42 keeps redirecting the line FIFO output so that the output lines circulate as 1/2, 3, 1/2, 3, etc.

Figure 7A:
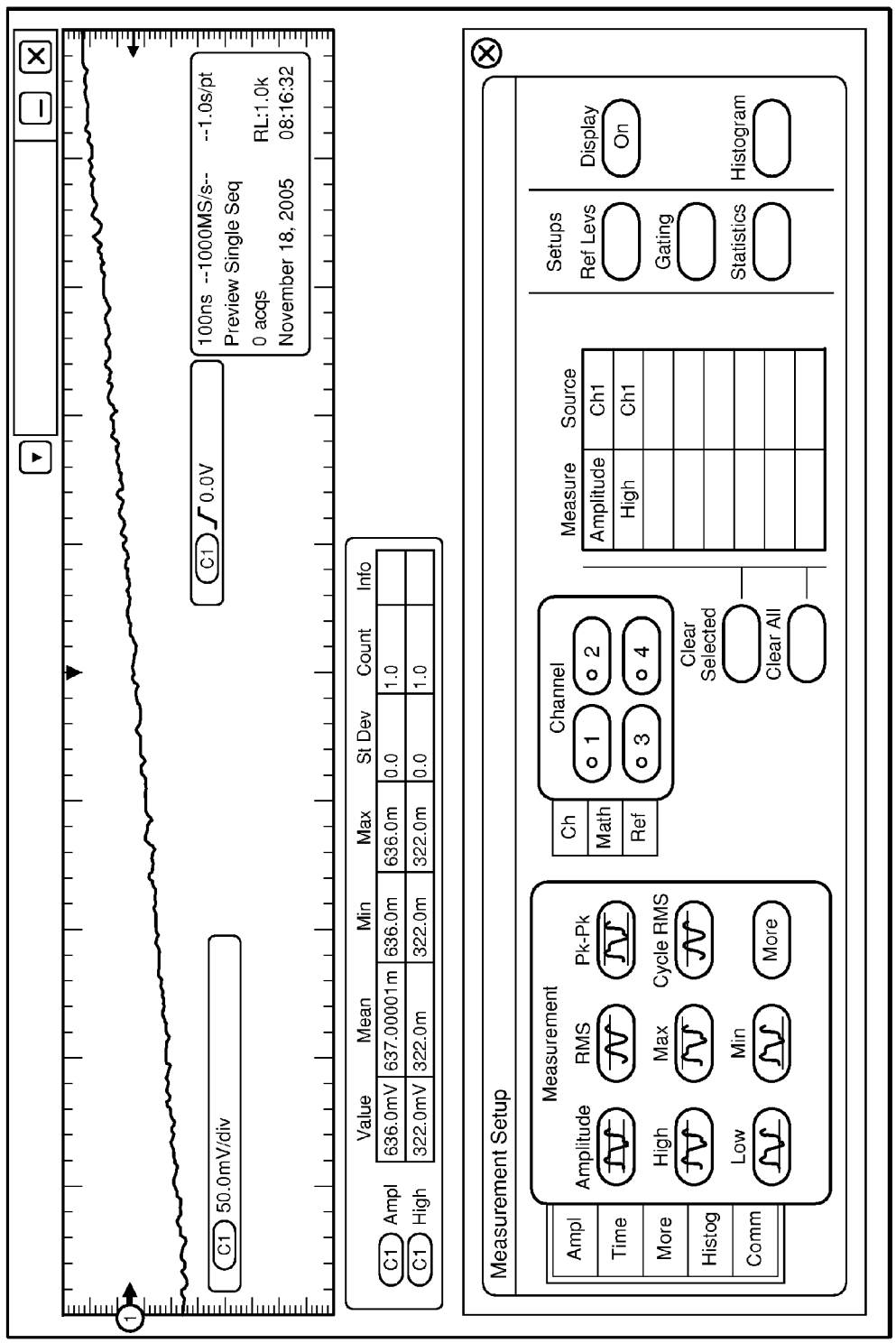
FIGS. 7a, 7b and 7c are plan views of down-scaled waveform image displays at different compression factors according to the present invention.
Figure 7B:
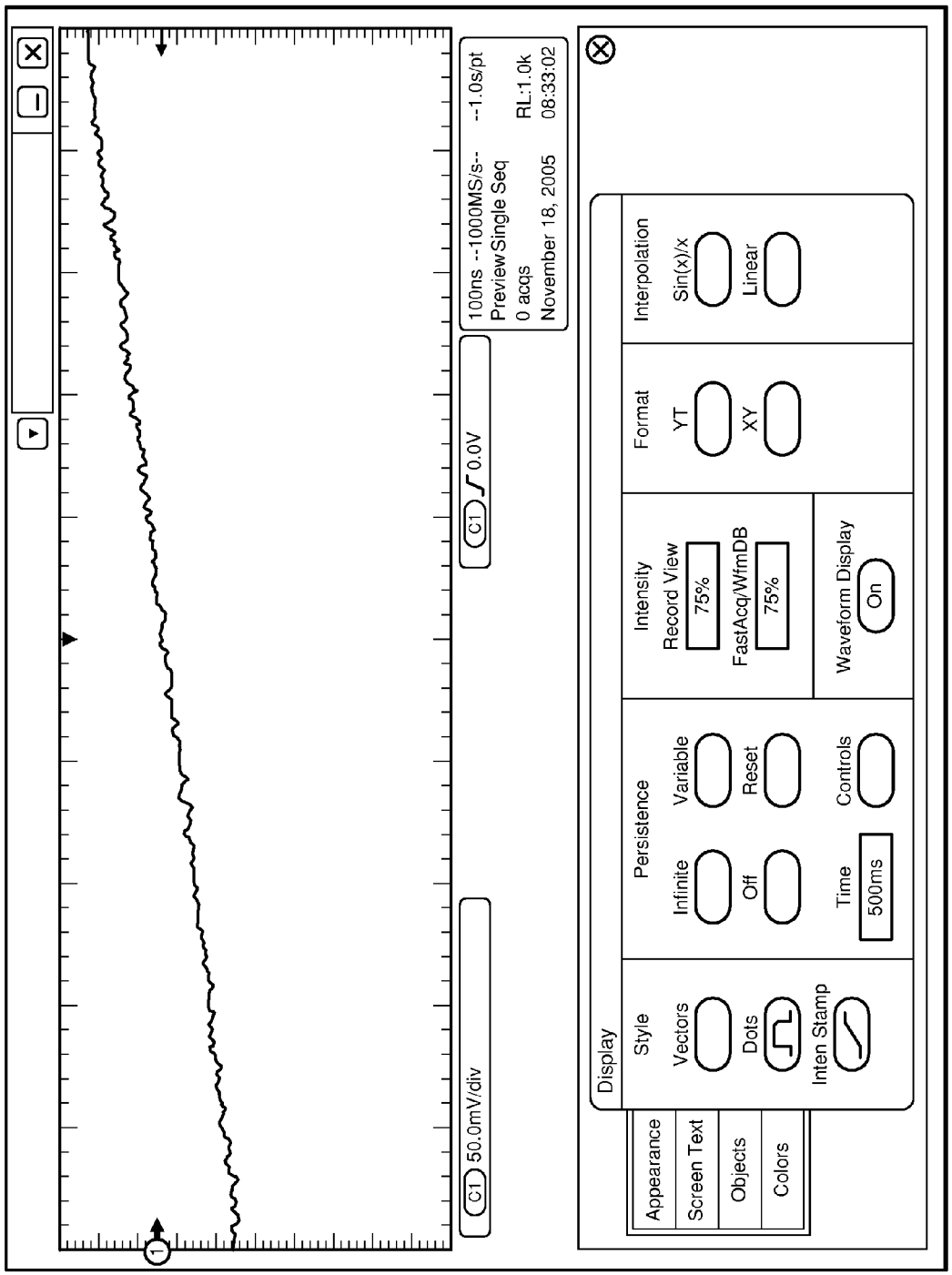
Figure 7C:
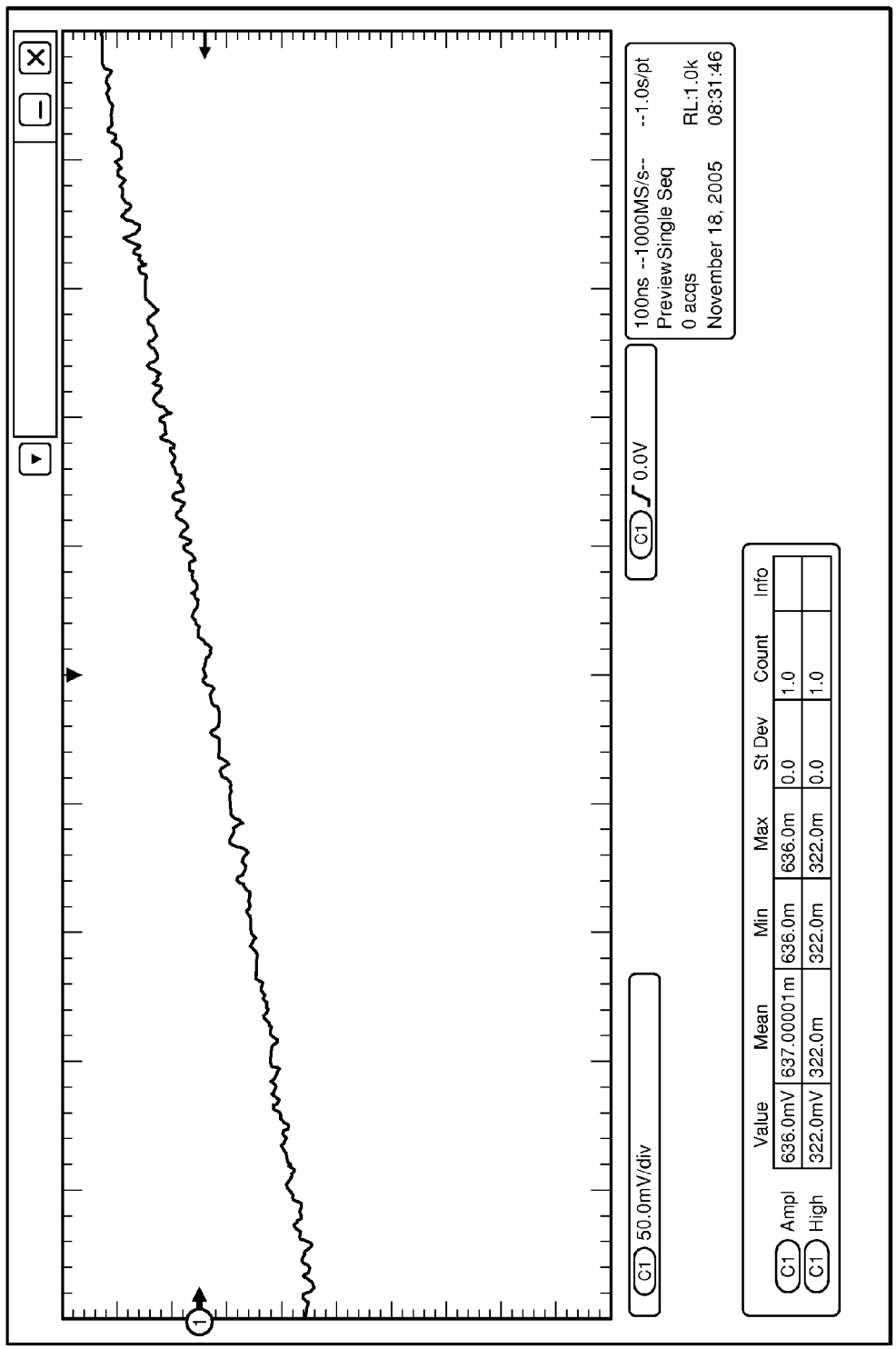

FIG. 6 shows a full scale waveform image view (1000× 500). FIGS. 7a, 7b and 7c show down-scaled waveform image views corresponding to compression factors of approximately 3:1, 2:1 and 3:2 respectively. Comparing these views, especially FIG. 7a, with the prior art image shown in FIG. 1, it is apparent that the dim and missing sections have been eliminated and the viewer is provided with a more pleasing display of the waveform image in the compressed form.

Although the above detailed description is for an example of vertical compression, the lines may also be compressed horizontally in a similar manner. The line FIFOs 26, 28, 30 are replaced with column FIFOs so the output from the input demultiplexer 24 provides successive data points of the waveform image data to the column FIFOs in the 1, 2, 3, 1, 2, etc. loop pixel-by-pixel, the redirection section 32 operates on a pixel rather than a line basis to provide column outputs, and the compression LUT 44 provides control to the output multiplexer 38 on a column-by-column basis. If both vertical and horizontal compression of the waveform image are desired, the vertical compression may be performed first followed by the horizontal compression.

Thus the present invention provides a realtime display compression circuit/algorithm that preserves pixel intensity for the waveform image when compressed by applying a priority algorithm to pixels that are combined vertically and/or horizontally rather than averaging, and then converting the pixels to video for input to a graphics chip for display.

What is claimed is:

1. An apparatus for realtime display compression of an uncompressed waveform image stored in a raster memory of a test and measurement instrument, comprising:
    an input demultiplexer, coupled to receive data representative of said uncompressed waveform image from said raster memory, separating said data representing the uncompressed waveform image into a plurality of lines of data and providing the plurality of lines of data to a plurality of line buffers, wherein each of the lines of data from the plurality of lines of data is provided to each of the line buffers from the plurality of line buffers sequentially;
    a redirection section, coupled to said input demultiplexer, aligning outputs from each of the line buffers according to a desired compression ratio compression to provide redirected outputs;
    a pixel combiner, coupled to said redirection section, combining corresponding pixels from the redirected outputs from the redirection section to provide a plurality of compressed output lines having separate integer compression ratios based on a priority algorithm, which black pixel is given a low priority so that any pixel of color including white is selected over the black pixel so that intensity information is retained in the plurality of compressed output lines;
    an output multiplexer, coupled to said pixel combiner, selecting a particular compression output from the plurality of compressed output lines for the compressed waveform image according to the desired compression ratio;
    a display device section of said test and measurement instrument, said display device coupled to receive and display said compressed waveform image;
    said display device operating in a first mode of operation in which said uncompressed waveform image is displayed on said display screen of said test and measurement instrument in a first portion of said display screen, and operating in a second mode of operation in which said compressed waveform image is displayed on said display device of said test and measurement instrument in a second portion of said display screen, said second portion being smaller in area than said first portion.

2. A method of realtime display compression of an uncompressed waveform image stored in a raster memory of a test and measurement instrument to form a compressed waveform image for display, the method comprising:
    separating said data representing the uncompressed waveform image into a plurality of lines of data and providing the plurality of lines of data to a plurality of line buffers, wherein each of the lines of data from the plurality of lines of data is provided to each of the line buffers from the plurality of line buffers sequentially by the input demultiplexer;
    using a compression circuitry performing the following steps:
        aligning outputs from each of the line buffers according to a desired compression ratio compression to provide redirected outputs;
        combining corresponding pixels from the redirected outputs to provide a plurality of compressed output lines having separate integer compression ratios based on a priority algorithm, which black pixel is given a low priority so that any pixel of color including white is selected over the black pixel so that intensity information is retained in the plurality of compressed output lines;
        selecting a particular compression output from the plurality of compressed output lines for the compressed waveform image according to the desired compression ratio;
    displaying said uncompressed waveform image on a display screen of said test and measurement instrument in a first mode of operation and a first portion of said display screen; and
    displaying said compressed waveform image on said display device of said test and measurement instrument in a second mode of operation and a second portion of said display screen, said second portion being smaller in area than said first portion.

* * * * *